(12) United States Patent
Dalal et al.

(10) Patent No.: US 7,947,592 B2
(45) Date of Patent: May 24, 2011

(54) THICK METAL INTERCONNECT WITH METAL PAD CAPS AT SELECTIVE SITES AND PROCESS FOR MAKING THE SAME

(75) Inventors: Hormazdyar Minocher Dalal, LaGrangeville, NY (US); Jagdish Prasad, Pocatello, ID (US); Hocine Bouzid Ziad, Kortrijk (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 784 days.

(21) Appl. No.: 12/012,120

(22) Filed: Jan. 31, 2008

(65) Prior Publication Data

US 2009/0152100 A1 Jun. 18, 2009

Related U.S. Application Data

(60) Provisional application No. 61/007,714, filed on Dec. 14, 2007.

(51) Int. Cl.
*H01L 21/44* (2006.01)

(52) U.S. Cl. ............... 438/614; 257/E23.069; 257/780; 257/781; 257/784; 438/612; 438/617

(58) Field of Classification Search ........... 257/E23.024, 257/E23.069, 751, 774–776, 778–781, 784, 257/786; 438/108, 612–614, 617, 666
See application file for complete search history.

(56) References Cited

U.S. PATENT DOCUMENTS

| | | | | |
|---|---|---|---|---|
| 4,880,708 A * | 11/1989 | Sharma et al. | | 428/620 |
| 6,066,877 A | 5/2000 | Williams et al. | | |
| 6,372,586 B1 | 4/2002 | Efland et al. | | |
| 6,426,556 B1 * | 7/2002 | Lin | | 257/738 |
| 6,472,304 B2 | 10/2002 | Chittipeddi et al. | | |
| 6,720,243 B2 * | 4/2004 | Weng | | 438/612 |
| 6,737,353 B2 * | 5/2004 | Fang et al. | | 438/652 |
| 6,838,762 B2 * | 1/2005 | Tao et al. | | 257/690 |
| 6,853,078 B2 * | 2/2005 | Yamaya et al. | | 257/750 |
| 6,878,633 B2 * | 4/2005 | Raskin et al. | | 438/694 |
| 6,940,169 B2 * | 9/2005 | Jin et al. | | 257/738 |
| 6,979,647 B2 * | 12/2005 | Bojkov et al. | | 438/687 |
| 7,045,903 B2 | 5/2006 | Efland et al. | | |
| 7,129,532 B2 * | 10/2006 | Lee | | 257/228 |
| 7,132,726 B2 | 11/2006 | Rueb et al. | | |
| 7,235,844 B2 | 6/2007 | Itou | | |
| 7,329,562 B2 * | 2/2008 | Kumamoto et al. | | 438/108 |
| 7,348,262 B2 * | 3/2008 | Lee et al. | | 438/459 |
| 7,420,283 B2 * | 9/2008 | Ito | | 257/779 |
| 7,423,348 B2 * | 9/2008 | Lu | | 257/783 |
| 7,465,654 B2 * | 12/2008 | Chou et al. | | 438/614 |
| 7,709,956 B2 * | 5/2010 | Naem et al. | | 257/758 |
| 7,728,431 B2 * | 6/2010 | Harada et al. | | 257/750 |
| 7,785,917 B2 * | 8/2010 | Park | | 438/70 |
| 7,800,239 B2 * | 9/2010 | Dalal et al. | | 257/781 |

\* cited by examiner

*Primary Examiner* — Chris Chu

(74) *Attorney, Agent, or Firm* — Aziz M. Ahsan; Ahsan & Associates, PLLC

(57) ABSTRACT

The present invention relates to a high power IC (Integrated Circuit) semiconductor device and process for making same. More particularly, the invention encompasses a high conductivity or low resistance metal stack to reduce the device R-on which is stable at high temperatures while in contact with a thick aluminum wire-bond that is required for high current carrying capability and is mechanically stable against vibration during use, and process thereof. The invention further discloses a thick metal interconnect with metal pad caps at selective sites, and process for making the same.

23 Claims, 9 Drawing Sheets n-LDMOS POWER TRANSISTOR CIRCUIT ELEMENT
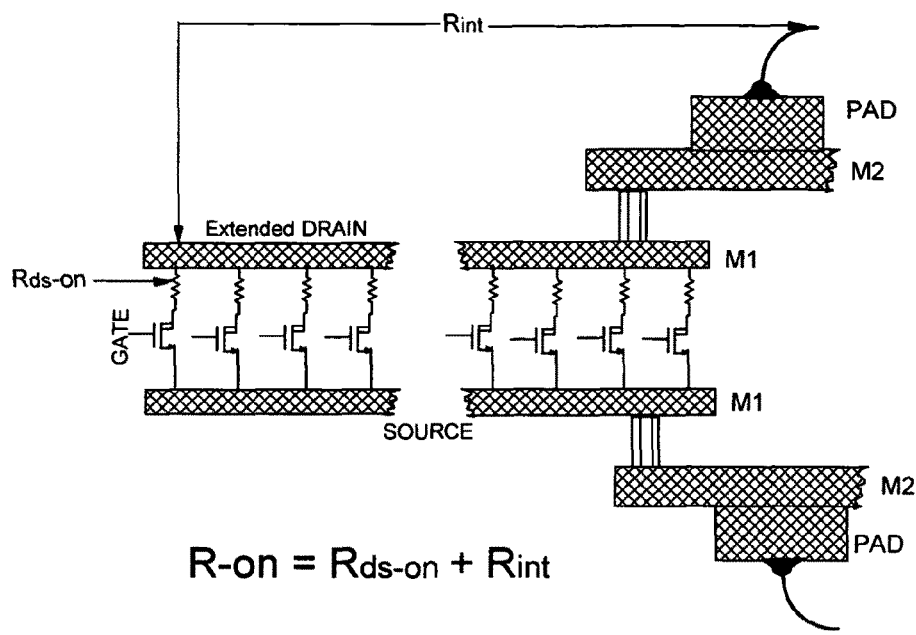
$R\text{-on} = R_{ds\text{-on}} + R_{int}$
FIG. 3A (Prior Art)
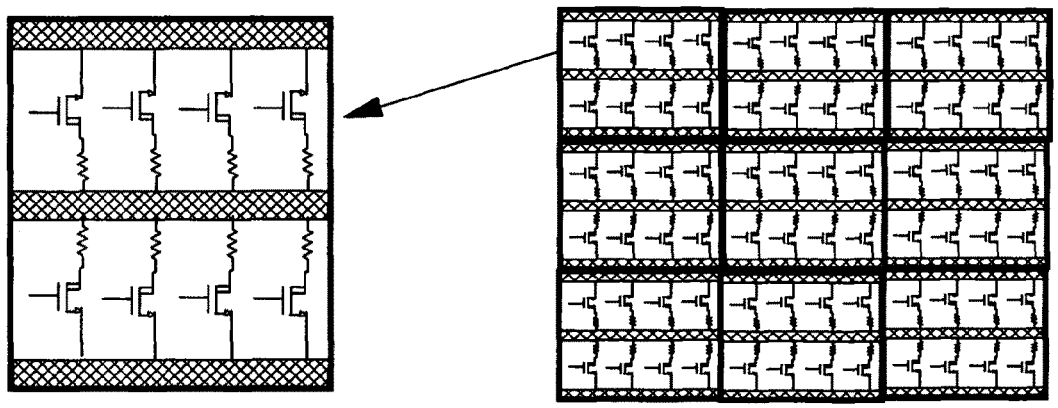
FIG. 3C (Prior Art)  FIG. 3B (Prior Art)

As deposited passivation

After passivation etch

THICK METAL INTERCONNECT WITH METAL PAD CAPS AT SELECTIVE SITES AND PROCESS FOR MAKING THE SAME

CROSS-REFERENCE TO RELATED APPLICATION

The instant patent application is related to U.S. Provisional Patent Application Ser. No. 61/007,714, filed on Dec. 14, 2007, titled "Thick Metal Interconnect With Metal Pad Caps At Selective Sites And Process For Making The Same," the disclosure of which is incorporated herein by reference.

FIELD OF THE INVENTION

The present invention relates to a high power IC (Integrated Circuit) semiconductor device and process for making same. More particularly, the invention encompasses a high conductivity or low resistance metal stack to reduce the device R-on which is stable at high temperatures while in contact with a thick aluminum wire-bond that is required for high current carrying capability and is mechanically stable against vibration during use, and process thereof. The invention further discloses a thick metal interconnect with metal pad caps at selective sites, and process for making the same.

BACKGROUND INFORMATION

FIG. 1, shows a simplified schematic cross-section of a portion of an integrated circuit (IC) chip with a diffused drain power transistor, illustrating a typical n-type Laterally Diffused drain Metal Oxide Silicon (n-LDMOS) power transistor structure in silicon substrate 100, of the prior art, where on a p-substrate, an N-tub and a N-buried layer is formed by methods well known in the art. The structure 100, typically has an inter-metal dielectric (IMD) layer or film 105, with drain 101, in an N-well, source 102, gate 103, and extended drain 110. These power transistors use an extended drain 110, with low doping concentration to prevent the inversion layer, which is initiated at drain contact 101, when power is off, from extending into the gate region 103. It is well known that the low doping and extended drain region 110, is the main source of high Rds-on in power transistors.

The typical circuit layout for power transistors, as illustrated in FIG. 1, is to linearly lay these power transistors in a linear array with parallel circuit connections as more clearly shown in FIG. 3A, of various components of an IC contributing to R-on. Furthermore, FIG. 3B shows equivalent circuits of power transistors laid out in area array form, while FIG. 3C is an enlarged view of the equivalent circuits as shown in FIG. 3B. This linear array layout of FIG. 3A, is generally used by designers to keep the interconnect resistance at the minimum and to keep the temperature low and uniform. Accordingly, a semiconductor integrated circuit for high voltage application is characterized by a large circuit area for its lateral organization of power transistors, and these individual transistors themselves are relatively large, being comprised of a low-doped extended drain area required for high blocking voltages.

In addition to larger silicon area, which implies a higher product cost, the large device area also limits the electric current level that can be used, particularly because of the "hot-spot" generation.

In power devices, a parameter of importance is "R-on" which is broadly comprised of two components, Rds-on and Rint. The Rds-on is characterized by the given semiconductor process technology node, device structure and operating conditions including device junction temperature. For a group of power transistors in a given technology node and device structure, configured in a given manner and operating at a given gate voltage Vgs and device junction temperature Tj, the Rds-on is mostly fixed. The Rint on the other hand is characterized by the metal interconnect resistance arising from metal traces and vias between the bond wire and source/drain contacts as shown in FIG. 3A. The Rint also comprises the bond wire resistance and the package resistance arising from leads, traces and vias, depending upon the package type.

To optimize circuit performance, circuit designers usually consider lowering the "specific resistance," Rsp, of the power transistor layout. The specific resistance, Rsp, is defined as a product of Rds-on and the power device area:

$$Rsp = Rds\text{-on} * \text{Device Area}.$$

Rds-on is more or less fixed as mentioned above, the interconnect metal resistance component of Rint, and thereby the value of Rint, can be reduced by utilizing a thick low resistivity metal interconnect, referred to hereinafter as "Power Metal." This is because:

$$R\text{-on} = Rds\text{-on} + Rint,$$

which is the reduction of Rint by the use of power metal, which reduces R-on.

FIG. 2, shows reduction of R-on with increasing thickness of Power Metal or PowerM (i.e., decreasing interconnect resistance). However, for a given application, the R-on is a fixed quantity, hence reduction of Rint by the use of power metal, allows one to increase the Rds-on; that allows reduced device area for a given Rsp.

Thus the main application of thick low resistivity power metal on power devices has been to shrink the device area for cost benefit. On the other hand, one may choose to use the Power Metal and keep the device area same and allow a higher Rds-on. Because the Rds-on is a direct function of device junction temperature, the use of Power Metal will thereby allow a higher junction temperature, Tj. Power transistors normally operate at about 150 C maximum junction temperature, however, with the use of Power Metal, transistors can thus operate up to 200 C junction temperature.

Applications requiring service at high temperature, such as, for example, alternator controller, under the hood applications, transmission control or brakes in automobile, to name a few, require the device to function at junction temperatures in the range of 150 C to 200 C. Such applications also require a high current, 4 A to 10 A with peak current going up to 30 A. A thick aluminum wire (wire diameter from about 8 mil to about 20 mil) is generally used for wire bonding on chip for its high current carrying capability (about 8 A to about 40 A), with mechanical strength to sustain high amplitude vibration and low cost. For such applications the three preferred choices for power metal are Copper, Aluminum and Gold. Silver is another choice but it suffers from strong atmospheric corrosion susceptibility. It should be noted that the required thickness of power metal is in the range of about 8 um to about 35 um to play a beneficial role in power transistors. Presently, a metal film of such thickness can only be deposited by electroplating technique. Because aluminum cannot be electroplated, the choice of power metal is limited to either Copper or Gold. Both of these metals are metallurgically incompatible with Aluminum that is used for wire bond as mentioned above. Basically, Aluminum forms intermetallic compounds with either Copper or Gold giving reliability problems in temperature storage test, especially above 150 C. For this reason the copper metal interconnects are usually coated with Nickel followed by a thin layer of Gold or Palladium/Gold.

Another significant problem in power devices is "hot spots." Because of the additional resistance coming from the extended drain 110, power transistors dissipate more energy, so the driver region of the IC chip becomes the hottest region, called "hot spots." Temperature in hot spots, depending upon the number of power transistors in a given array, the array layout, operating frequency and duty cycle, and leakage current, can rise up to 350 C. These localized hot spots that are significantly above the average die or chip temperature, limit the IC's performance and reliability. However, power metal provides an added advantage of reducing the intensity of a hot spot by spreading the heat. Accordingly, a power metal with high thermal conductivity is desired which is also thermally stable with Aluminum interconnect and bond wire at these hot spot temperatures.

The use of thick, low resistivity Power Metal interconnects in power devices has been explored in the prior art. For example, U.S. Pat. No. 7,132,726 (Rueb et al.), the disclosure of which is incorporated herein by reference, discloses a method to provide a thick aluminum pattern over power devices and a thin aluminum interconnect for a fine line pattern in logic circuit. First a 3 um thick aluminum interconnect is defined by wet etch process in power transistor area of the device die, followed by 0.8 um thick aluminum fine line pattern defined by Reactive Ion Etch (RIE) process. Rueb et al. disclose that at least about 10 um thick copper is required for R-on reduction to be beneficial. This translates to about 16 um thick Ti/Al-0.5% Cu interconnect metal thickness. To define interconnect metal pattern with metal thickness above about 3 um, the techniques such as wet etch, Reactive Ion Etch, Damascene or Metal Lift-off are not applicable in the required resolution range of less than 10 um. For metal thickness above 3 um, the usual metal interconnect formation technique involves electroplating into a negative pattern of interconnects defined by either positive or negative photoresist. There is no known electroplating technique for aluminum, hence, Rueb et al.'s teaching does not provide solutions to overcome the prior art problems.

U.S. Pat. No. 6,372,586 (Efland et al.), the disclosure of which is incorporated herein by reference, discloses a method to overlay a thick copper layer making contact to at least a part of the last aluminum metal layer of an IC device through the passivation layer. Efland uses the industry standard "electroplating through negative mask pattern" technique to deposit up to 20 um thick copper with TiW barrier.

U.S. Pat. No. 7,045,903 (Efland et al.), the disclosure of which is incorporated herein by reference, discloses an improved TiW/Cu structure which is obtained by electroplating Nickel and gold layers on top of copper. This structure provides superior gold wire-bond reliability. However, this structure has several shortcomings for high temperature high current applications, which require a large diameter aluminum wire bonding, such as, for example, at about 175 C the pure electroplated nickel diffuses almost through the copper layer underneath in about 100 hours, thereby substantially increasing the resistivity of the thick copper interconnect. Furthermore, the TiW/Cu or TiW/Cu/Ni/Au is not compatible with thick aluminum wire-bonding as aluminum and copper or gold (if gold is more than 1000 A thick) react to form CuAl2 or AuAl2 inter-metallic compound which is well known in the industry for poor reliability, especially above 150 C, due to Kirkendall void formation leading to Open-Circuit. Electroplating less than 3000 A thick gold is a non-manufacturable process because of high plating rate in the industry standard cyanide bath used for gold plating. One of the most serious shortcoming of these Power Metal structures is the unprotected copper sidewall, especially, with the presence of humidity, temperature and electrical bias, copper atoms migrate from the unprotected copper sidewalls causing electrical shorting between adjacent interconnect lines. With industry standard Highly Accelerated Stress Test (HAST) at 135 C/85% RH/5V bias, about 40% failure is observed in 96 hours for such structures.

U.S. Pat. No. 7,235,844 (Itou), the disclosure of which is incorporated herein by reference, discloses that covering the electroplated Cu/Ni/Au interconnect lines with a thick layer of polyimide does not prevent the copper migration from the sidewalls. Itou teaches to first form the TiW/Cu interconnect traces and then coat it with a barrier and aluminum layers on top and sides, followed by photolithography to remove the barrier and the aluminum between the traces. The atmospheric corrosion of aluminum is well known; as is standard practice in IC processing, Itou protects the aluminum coated copper traces from environmental effect by a polyimide passivation. Another photolithography process step is applied to open the bond pad areas. Wire is then bonded on aluminum coated copper pads through the openings in the polyimide. Whereas Itou's method could provide sidewall protection to copper traces, it requires additional expensive photolithography process steps. Furthermore, the wedge wire bonding required for large diameter aluminum wire bonding is not possible because the travel of the wire bond head will impact the polyimide sidewall unless very wide openings in the polyimide are provided, thus constraining the number of Input/Output contacts allowed.

U.S. Pat. No. 6,472,304 (Chittipeddi et al.), the disclosure of which is incorporated herein by reference, discloses the protection of a copper sidewall by Tantalum. However this method requires the Damascene method to form the copper traces. Apart from being an expensive process, the Damascene method is not applicable to thick metal interconnect, as there is no practical way to etch deep trenches in the oxide layer before the pattern defining resist is eroded away. Wire-bonding through openings in polyimide is also required in the structure taught by Chittipeddi et al. thus limiting its application as discussed earlier.

U.S. Pat. No. 6,066,877 (Williams et al.), the disclosure of which is incorporated herein by reference, discloses the plating of a nickel layer on top of aluminum IC interconnects by an electroless plating method. With the high tensile intrinsic thin film stresses in electrolessly plated nickel films, $1 \times 10^{-10}$ to $5 \times 10^{-10}$ dynes/$cm^2$, the force in the film, stress×thickness, acting normal to the substrate builds up with the film thickness, causing metal film peeling. It is well established that about 5 um is the maximum nickel thickness, as above which nickel film peeling is frequently observed. For reliably safe processing, the electroless nickel film thickness is usually limited to 3 um.

Accordingly, bearing in mind the problems and deficiencies of the prior art, a need for an improved power metal stack in power devices exists.

PURPOSES AND SUMMARY OF THE INVENTION

The present invention provides a power metal stack, and a method for making the same, having low resistance and which is thermally stable with aluminum wire bond at high temperatures. A thick power metal interconnect of Copper or Gold is defined, followed by a polyimide coating and photo-lithographically making openings in the polyimide. Wire bond pads of Aluminum with TiW barrier are defined at the openings using metal sputtering, photolithography and metal wet etch.

It is therefore a purpose of the present invention to provide a power metal stack, in semiconductor circuits comprised of power devices and integrated with logic and memory circuits, which is thermally stable with large diameter aluminum wire bonding.

Another purpose of the present invention is to provide a power metal stack that is thermally stable with aluminum wire bond at least up to about 1000 hours at about 225 C.

It is yet another purpose of the present invention to provide a power metal stack that is thermally stable with aluminum interconnects and aluminum bond wire up to about 24 hours at about 300 C to endure the hot spot thermal excursions accumulated during the application service time period.

It is still another purpose of the present invention to provide a power metal stack capable of protecting the power devices underneath the bond pad from mechanical forces during large diameter aluminum wire wedge bonding.

It is a further purpose of the present invention to provide a power metal stack with a sheet resistivity less than about 2 m-ohm/square.

Therefore, in one aspect this invention comprises a process for providing a power metal interconnection (115) with a metal cap (117/118) on a substrate (100) having at least one exposed interconnect metal feature (107), said process comprising the steps of:

(a) depositing at least one dielectric layer (112) over said at least one exposed interconnect metal feature (107) and said substrate (100);

(b) defining a photolithographic pattern for at least one power metal interconnect (115) over said substrate (100), and etching said at least one dielectric layer (112) to expose said interconnect metal feature (107) on said substrate (100);

(c) sputter depositing a seed layer (114/113), wherein said seed layer (114/113) comprises a first barrier layer (114) and a low resistivity power metal layer (113);

(d) defining a photoresist pattern for at least one power metal interconnect (115), and selectively removing photoresist from said at least one power metal interconnect locations (114/113) such that at least a portion of said low resistivity power metal layer (113) is exposed;

(e) electroplating a low resistivity power metal layer (115) using said seed layer (114/113) as an electrode;

(f) removing said photoresist, and wet-etching said seed layer (114/113) using said electroplated metal (115) as a mask, and forming said power metal interconnect (115);

(g) depositing at least one layer of at least one flowable dielectric (116);

(h) photolithographically defining a pattern for at least one pad-via layout (135) in said flowable dielectric layer (116);

(i) opening said at least one pad-via (135) to expose a portion of said power metal (115);

(j) sputter cleaning and sequentially sputter depositing a second barrier layer (117) and a wire bondable metal (118) over said at least one pad-via (135); and (k) photolithographically defining a pattern for a pad layout and etch removing said wire bondable metal (118) and said second barrier layer (117).

In another aspect this invention comprises a process for providing a power metal interconnection (115) with a metal cap (125/127) on a substrate (100) having at least one exposed interconnect metal feature (107), said process comprising the steps of:

(a) depositing at least one dielectric layer (112) over at least one interconnect metal feature (107) on said substrate (100);

(b) photolithographically defining a pattern for a power metal interconnect (115) and etching said dielectric layer (112) to expose a portion of said interconnect metal feature (107);

(c) sputter depositing a seed layer (114/113), wherein said seed layer (114/113) comprises a first barrier layer (114) and a copper power metal layer (113);

(d) defining a negative photoresist pattern for said power metal interconnect (115) over said substrate (100);

(e) electroplating a copper power metal layer (115) using said seed layer (114/113) as an electrode;

(f) removing said photoresist and wet etching said seed layer (114/113) using said electroplated copper (115) as mask, and forming a copper power metal interconnect (115);

(g) depositing at least one layer of a flowable dielectric (116) over said substrate (100);

(h) photolithographically defining a pattern for a pad-via layout (135) in said flowable dielectric layer (116);

(i) opening a pad-via (135) to expose at least a portion of said copper power metal interconnect (15);

(j) electroless Nickel-Phosphorus plating (125) said exposed copper surface (15) and forming a Nickel-Phosphorus wire bond pad (125) on top of said copper power metal interconnect (115); and (k) plating said Nickel-Phosphorus wire bond pad (125) with a layer of gold (127).

In yet another aspect this invention comprises a process for providing a power metal interconnection (15) with protective surface coating (120/121) on a substrate (100) having at least one exposed interconnect metal feature (107), said process comprising the steps of:

(a) depositing a dielectric layer (112) over said interconnect metal feature (107) and said substrate (100);

(b) defining a pattern for a power metal interconnect (15) and etching said dielectric layer (112) to expose said interconnect metal feature (107);

(c) sputter depositing a seed layer (114/113) comprising of a first barrier metal layer (114) and a first copper power metal layer (113);

(d) defining a negative photoresist pattern for said power metal interconnect (15) over said substrate (100);

(e) electroplating a second copper power metal layer (115) using said seed layer (114/113) as an electrode;

(f) removing said photoresist and wet etching said seed layer (114/113) using said electroplated copper layer (115) as mask, and forming a copper power metal interconnect (115);

(g) electroless Nickel-Phosphorus plating (120) said copper power metal interconnect (115) and encasing at least a portion of said copper power metal interconnect (115) with a coating of a Nickel-Phosphorus layer (120), and (h) plating said coating of said Nickel-Phosphorus layer (120) with a layer of gold (121).

In still yet another aspect this invention comprises a process of providing power metal interconnections (115) on a substrate (100) having at least one exposed interconnect metal feature (107), said process comprising the steps of:

(a) depositing a dielectric layer (112) over said interconnect metal feature (107) and said substrate (100);

(b) photolithographically defining a pattern for a power metal interconnect (115) and etching said dielectric layer (112) to expose said interconnect metal feature (107);

(c) sputter depositing a seed layer (114/113), wherein said seed layer (114/113) comprises of a barrier layer (114) and a gold layer (113);

(d) defining a negative photoresist pattern for said power metal interconnect (115);

(e) electroplating a gold power metal (115) using said seed layer (114/113) as an electrode; and (f) removing said photoresist and wet etching said seed layer (114/113) using said electroplated gold (115) as mask forming a gold power metal interconnect (115), and wherein said gold power metal interconnect (115) comprises said sputter deposited gold layer (113) and said electroplated gold power metal layer (115).

BRIEF DESCRIPTION OF THE DRAWINGS

The features of the invention and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

FIG. 3A illustrates various components of an IC contributing to R-on.

FIG. 3B shows equivalent circuits of power transistors laid out in area array form.

FIG. 3C is an enlarged view of the equivalent circuits of FIG. 3B.

DETAILED DESCRIPTION

Unless defined otherwise, all technical and scientific terms used herein have the same meaning as commonly understood by those of ordinary skill in the art to which this invention belongs.

Figure 1:
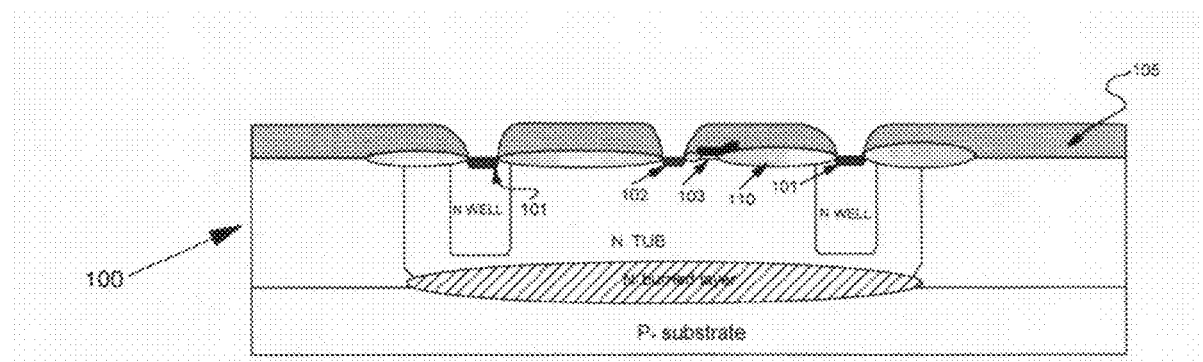
FIG. 1 shows a simplified schematic cross-section of a portion of an integrated circuit (IC) chip with a diffused drain power transistor.
Figure 2:
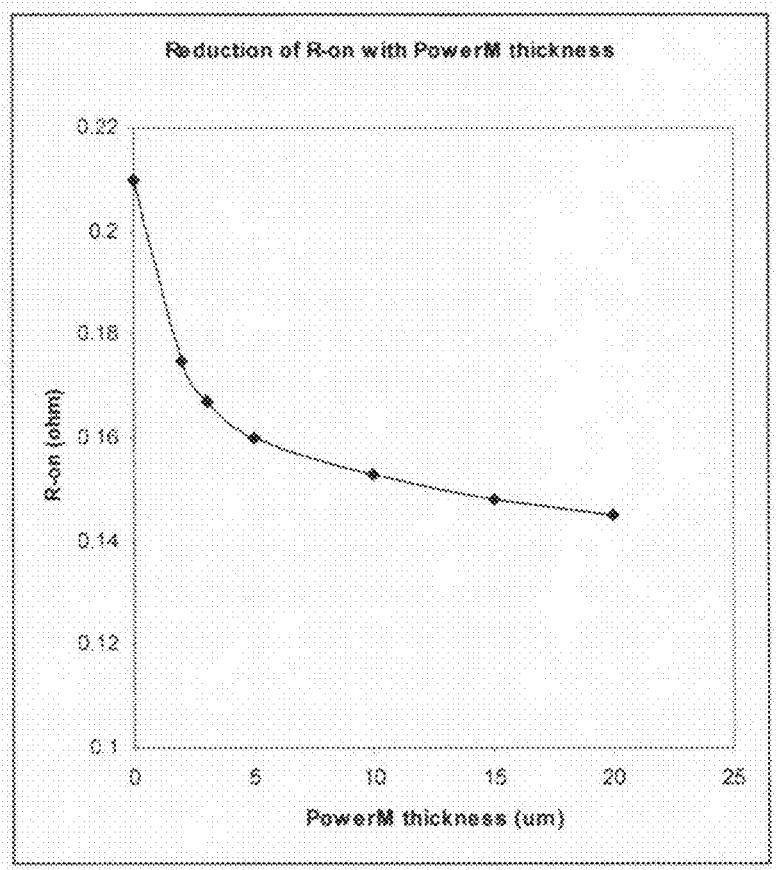
FIG. 2 shows the relation between reduction of R-on of Power Transistor and the reduced interconnect resistance as represented by Power Metal thickness.
Figure 4:
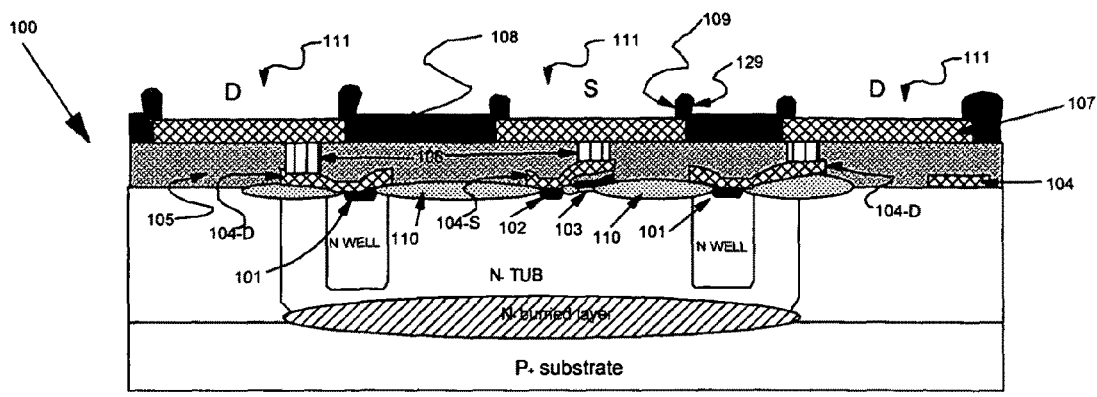
FIG. 4 shows a cross-section of a prior art IC with power transistor.

Reference will be made now to FIGS. 4 to 7 of the drawings in which like numerals refer to like features of the invention. Referring to FIG. 4, there is shown a cross-section of a present day n-type Laterally Diffused drain Metal Oxide Silicon (n-LDMOS) power transistor structure in silicon substrate 100. The source 102, the drain 101 and the gate 103 form the basic electrodes of a MOS device. It should be understood that whereas cross-section of only a power transistor is shown here, an Integrated Circuit (IC) also contains standard transistors for several other functions, such as, digital logic, analog functions, to name a few. One of the main feature distinguishing the power transistor from the standard transistor is the extended drain 110.

Figure 9A:
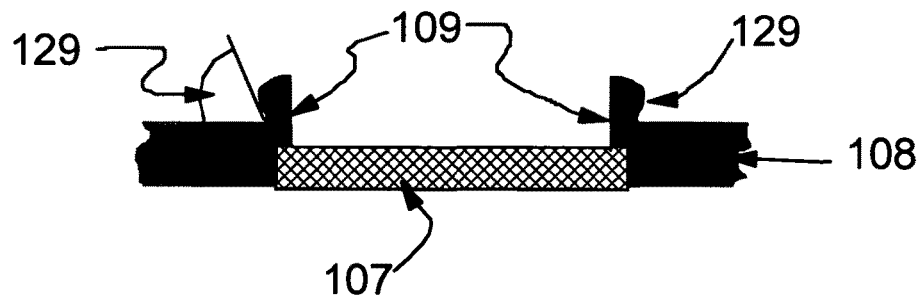
FIG. 9A shows vertical walls of etched via present in the prior art process.

A first level interconnect metal 104, 104-S, 104-D is defined to interconnect the power transistor electrodes 101, 102 and 103 in a required manner for a power transistor circuit, such as a linear array of power transistors as shown in FIG. 3A, especially components of an IC that contribute to R-on. An area array as shown in FIG. 3B, which shows the equivalent circuits of power transistors laid out in area array form, while FIG. 3C, is an enlarged view of the equivalent circuits of FIG. 3B. An inter-metal dielectric (IMD) film or layer 105 is then deposited and via-studs 106 are formed. It should be understood that it is not necessary to use via-stud technology and one may choose to form via holes in the IMD film or layer 105. The second level of interconnection 107 is then defined. The process steps of defining via-studs and metal interconnect levels may be repeated if more levels of interconnections are desired. After the final level of interconnection, layer 107 is formed, a silicon nitride passivation layer or film 108, is deposited and bond pad metal 111 are opened. The process described here forms the present day structure of power transistor integrated circuits whose cross-section is illustrated with reference to FIG. 4. For such technologies, Aluminum-alloy metallurgies are invariably used for interconnect. Furthermore, a Plasma Enhanced Chemical Vapor Deposition (PECVD) technique with Silane/Ammonia chemistry is typically used to deposit the silicon nitride passivation film 108. As shown in FIG. 4, and more clearly shown in FIG. 7A, a characteristic of the nitride passivation film 108, of prior art is formation of negatively sloped or vertical sidewall 129 in the passivation layer 108 at edges of interconnect metal 107. Furthermore, in order to maximize the bond pad metal area 111, an anisotropic etch is used to reduce the passivation overlap width on pad metal 111. The anisotropic etch of the prior art causes near vertical via walls 109, as shown in FIG. 9A.

The process described above forms the cross-section of FIG. 4 that is the power transistor integrated circuit structure of present day art. To those skilled in the art, it should be evident that the above structure could be modified by interchanging metallurgies, passivations, associated etches, the process sequence and methods for defining the interconnect lines or via connects, and adding more interconnect layers. By way of example, copper or aluminum metallurgies could be used for interconnect lines; either etched via holes or via-studs could be used for inter metal connections; and, the inter-metal dielectric (IMD) could be planarized or non-planarized.

Those skilled in the art will recognize that the materials, tools and processes used to make the prior art substrate 100, as described above are specifically designed to achieve fine dimensions which are required in Integrated Circuit fabrication. For example, the interconnection metal thickness is less than about 1.00 um to define the typically required interconnects line width of less than about 1.0 um. Furthermore, the methods and tools of the prior art substrate 100, are not amenable to interconnections thicker than about 3 um.

For thicker interconnect metal, an electroplating process is generally used. Among the low resistivity metals, only copper or gold is amenable to electroplating. Both of these metals have great affinity to react with Aluminum interconnect. Accordingly, a continuous barrier, which is metallurgically stable with Aluminum and with Copper or Gold, is required. Titanium, Titanium Nitride, Titanium Tungsten, Tungsten, Tantalum, Tantalum Nitride or any combination thereof, is commonly used as a barrier layer. These barrier materials are invariably deposited on wafers using Physical Vapor Deposition (PVD) techniques, such as sputtering or evaporation.

Figure 5A:
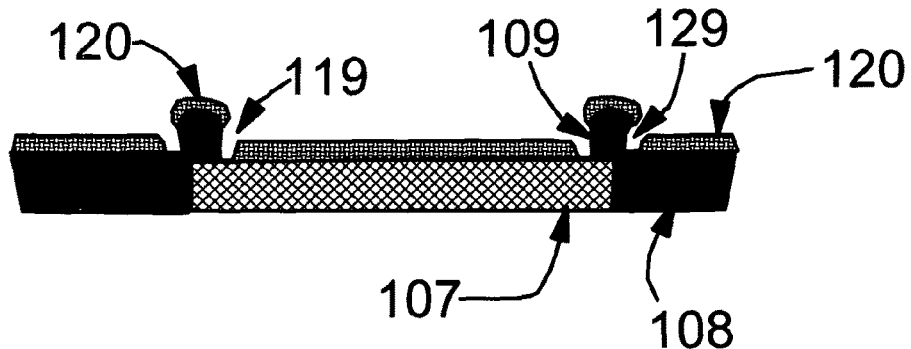
FIG. 5A shows an enlargement of the bond pad area in FIG. 4, illustrating that the negative slope in passivation at metal edge will cause a discontinuity in a barrier metal deposited on top of the passivation.
Figure 5B:
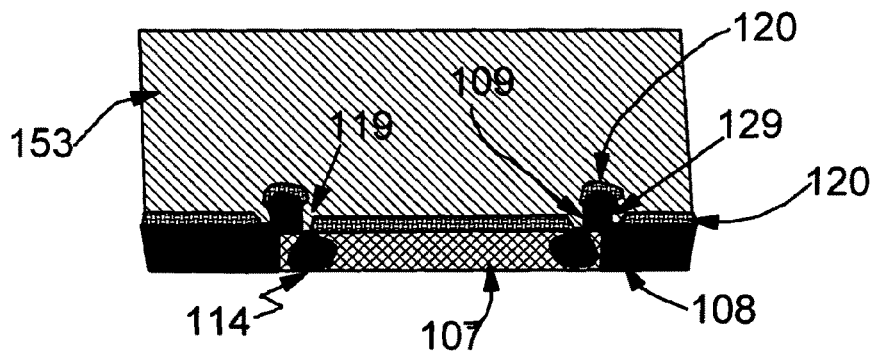
FIG. 5B shows penetration of the power metal through discontinuity in barrier metal and reacting with interconnect metal of IC, which causes reliability failures.

A characteristic of PVD technique is that the deposition takes place in a line of sight. Referring now to FIGS. 5A and 5B, when a barrier layer 120, is deposited, such as, by PVD technique on a passivation layer 108, with negative sloped step walls 129, or near vertical via walls 109, of present day prior art in FIG. 4, discontinuity 119, or considerably thinned down area 119, are formed, as more clearly shown in FIG. 5A. This discontinuity 119, in the barrier layer 120, are the source of reliability failure caused by open circuit. The open circuit is caused by penetration of low resistivity metal 153, with time and temperature, through these discontinuities 119, in the barrier layer 120, and reacting with the final interconnection layer 107, such as, aluminum metal 107, thereby forming high resistance inter-metallic compound 114, as more clearly shown in FIG. 5B. FIG. 5A basically shows an enlargement of the bond pad area from FIG. 4, illustrating that the negative slope 129, in the passivation layer 108, near the metal edge will cause a discontinuity 119, in a barrier metal layer 120 that is deposited on top of the passivation layer 108. FIG. 5B, basically shows the penetration of the power metal through the discontinuity 119, in the barrier metal layer 120, and reacting with the interconnect metal 107, of the IC, and forming inter-metallic compound 114, which have been known to cause reliability failures.

Figure 6:
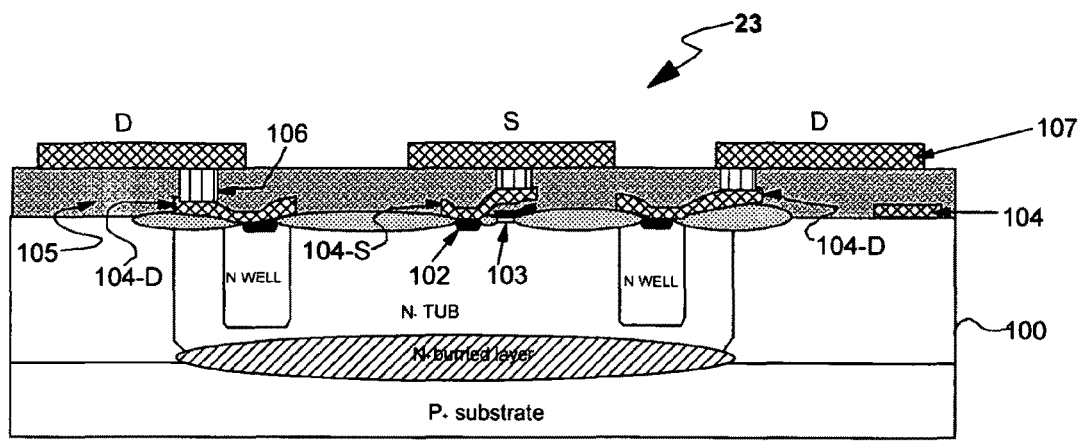
FIG. 6 shows a simplified schematic cross-section of an IC with power transistor processed up to a stage ready for the overlay of passivation; this illustrates the starting substrate for the present invention.

According to the preferred method of present invention, the conventional method of making power transistor circuits integrated with CMOS circuits, as described above and schematically presented in FIG. 4, is interrupted after the definition of the last or final interconnection metal layer 107. The cross-section of the power IC at this point in processing is shown in FIG. 6, and which becomes the starting substrate or die or chip or wafer structure 23, for the present invention.

In standard prior art practice of CMOS IC processing, a silicon nitride passivation layer 108, is next deposited on the substrate 100, by PECVD technique using silane, ammonia and nitrogen chemistry. In standard prior art practice for CMOS IC processing the passivation step structure at metal edge or via wall slope 109 does not play a crucial role; generally the passivation deposition process is optimized for higher deposition rate which results in a step structure at the metal edge shown in FIG. 7A. This negative slope 129, in passivation structure at the metal edge will cause discontinuities 119, or thinning 119, in the barrier layer, which is to be deposited in the next process step of the present embodiment, and thus this prior art process cannot be used because of the creation of the negative slopes 129. Furthermore, this negative slopes 129, obtained in the process of the prior art, especially, in closely spaced interconnect lines, the passivation with the negative slope surface topography forms cavities with capillary entrance or connections 137, as more clearly shown in FIG. 7B. Such cavities with capillary entrance or connections 137, trap electrolytes during further processing steps which then causes corrosion of the barrier layer of power metal to be deposited later in the process of this invention, and thus this process of the prior art cannot be used with the process of the present invention.

Figure 7A:
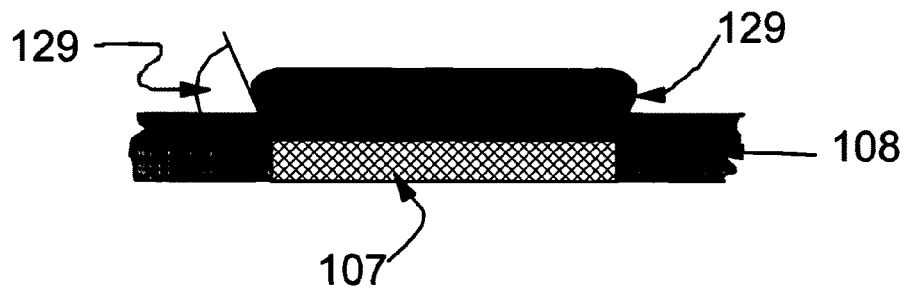
FIG. 7A is an enlarged view of negative slope in passivation at metal edge obtained in the prior art.
Figure 7B:
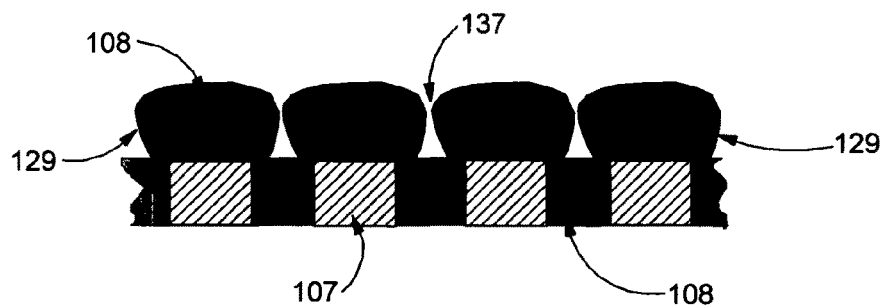
FIG. 7B shows formation of voids with capillary entrance in passivation over closely spaced interconnect lines as obtained in the prior art.
Figure 7C:
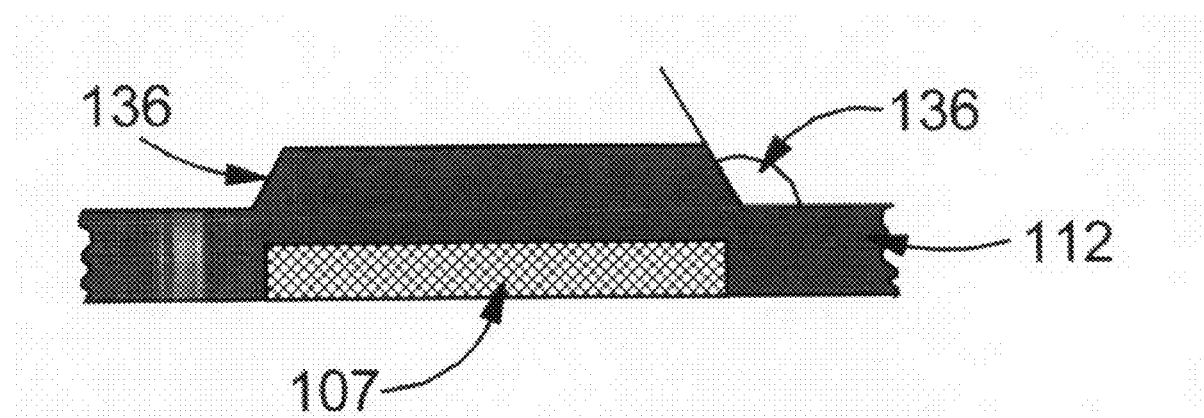
FIG. 7C shows positive slope at the metal edge in passivation deposited using the process of present invention.
Figure 7D:
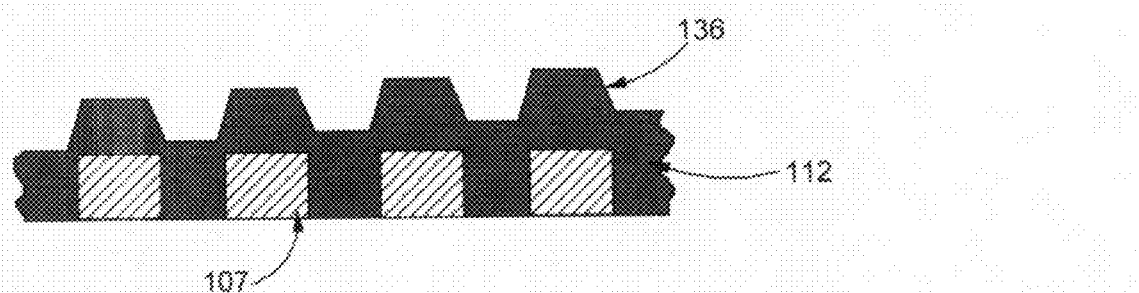
FIG. 7D shows absence of voids and capillary entrance in passivation over closely spaced interconnect lines at the metal edge in passivation deposited with the process of present invention.

A passivation having a step with positive slope at metal edge is required for the integrity of metal structure that is to be formed next in the process of the present invention. It has been discovered that a positive slope in the silicon nitride passivation layer 112, at the metal edge can be obtained with a higher nitrogen flow rate and slower deposition rate. FIG. 7C shows a structure having a positive slope 136, in the nitride passivation layer 112 at the metal edge, which was obtained by the optimized process parameters using the process of the present invention. The structure of such a passivation layer 112, on closely spaced interconnection lines underneath is void of any cavities or capillary entrance or capillary structure as more clearly shown in FIG. 7D.

Figure 8:
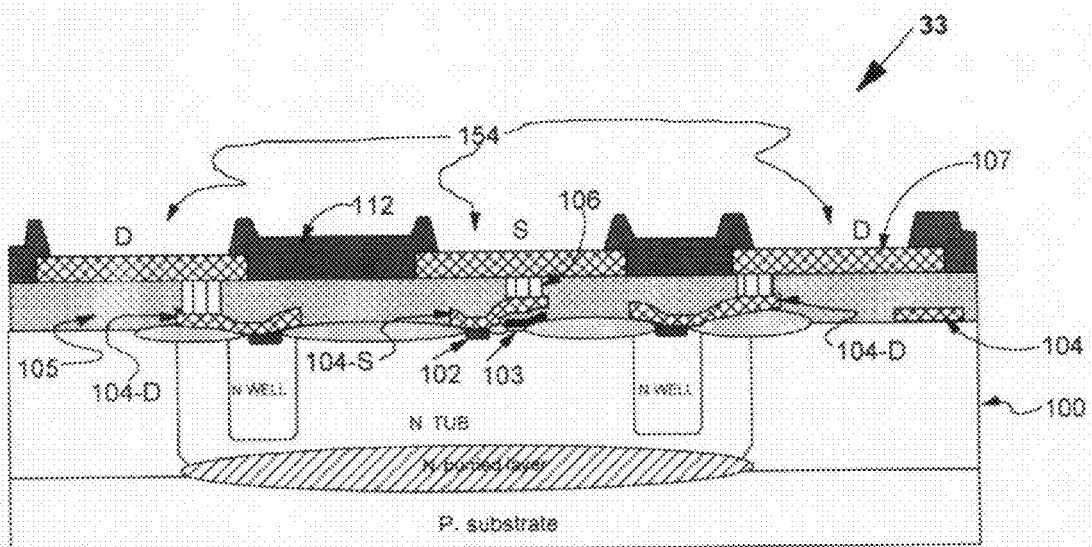
FIG. 8 shows a cross-sectional view of the IC substrate after passivation etch.

FIG. 8 shows a cross-sectional view of an IC substrate 33, after the passivation etch. Basically, via pattern 154, are defined photolithographically on top of the passivation layer 112, and the passivation layer 112, is Reactively Ion Etched (RIE) to expose the desired portion of the final level of interconnection metal layer 107, such as, an aluminum metal layer 107. After etching of the passivation layer 112, the resist is removed, and the wafer or substrate 33, is cleaned, such as, with a solvent. FIG. 8 also shows the cross-sectional view of the power transistor IC 33, after the deposition of the passivation layer 112 on the final level of interconnection metal layer 107, and the exposed areas are the via pattern 154.

The via mask for the process of FIG. 8 is designed to expose the final interconnection metal layer 107, where the thick low resistivity power metal is desired; generally, it is the source and drain interconnects, bus bars and the bond pad areas. It is preferred that the via mask is designed such that the passivation opening edge is at least 3 um recessed into the metal width from the metal line edge.

In the standard prior art CMOS IC processing an anisotropic etch is normally used to open passivation vias in an attempt to maximize the total bond pad area. Such anisotropic etch results in a near vertical via wall 109, as shown in FIG. 9A. The vertical wall 109, structure that is formed using the prior art methods should be totally avoided when make the structure of the present invention.

Figure 9B:
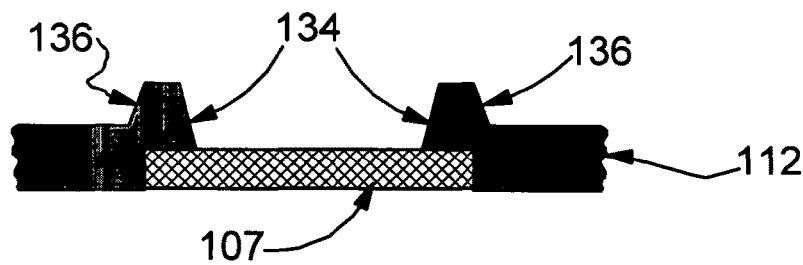
FIG. 9B shows sloped via walls in vias etched as per process of this invention.

It has been discovered that a combination of an isotropic and an anisotropic etch can be used to obtain a positive sloped inner via walls 134, as more clearly shown in FIG. 9B. The isotropic etching was carried out using Reactive Ion Etching (RIE) and using a chemistry of Helium+Nitrogen Trifluoride, and the substrates were held at a temperature of about 10° C. For an anisotropic RIE, a chemistry of CF4+CHF3+Ar was used with substrates held at room temperature. This anisotropic etch was continued to remove TiN Anti Reflection Coating (ARC) if used on top of the aluminum interconnect.

Figure 10:
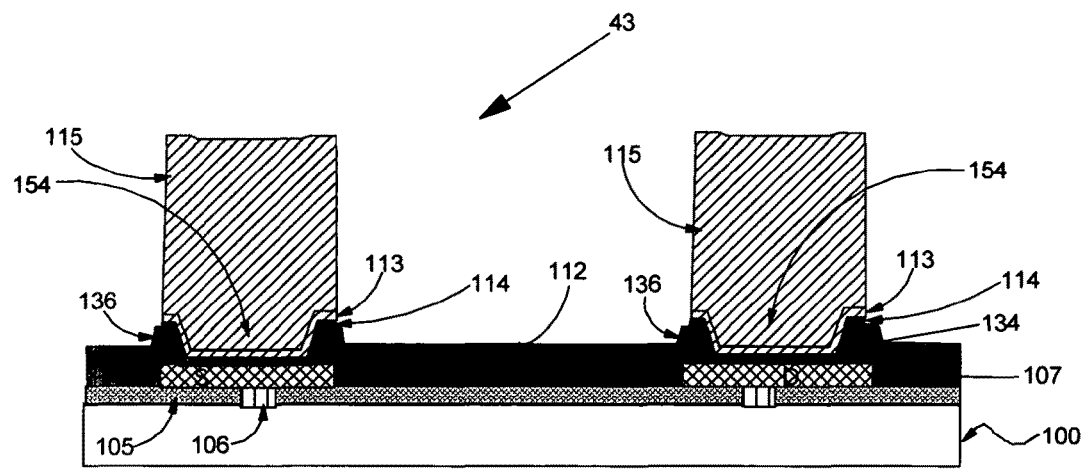
FIG. 10 shows a cross-section of an IC with power transistors and power metal defined.

The wafer or substrate 33, was next processed to define the power metal using the industry standard method of electroplating through resist. In this method, wafer or substrate 33, was loaded into a Physical Vapor Deposition tool, such as, for example, a multi-chamber sputter deposition tool. Wafer or substrate 33, was then RF sputter cleaned using pure Argon to etch an equivalent of about 150 A of SiO2. A seed layer, comprised of a barrier metal 114 and a low resistivity metal 113 was deposited, as shown in FIG. 10. The barrier metal 114 is generally Tungsten with about 10 atomic percent Titanium (TiW) and having a thickness of between about 2 kA to about 4 kA. The barrier metal 114 could be selected from a group comprising Titanium, Titanium-Tungsten, Chromium, Tantalum, Tantalum nitride or any combination thereof. The thickness of the low resistivity metal 113 is between about 0.5 kA to about 5 kA and it could be either Copper, or Gold, depending upon whether the desired power metal 115, which would be subsequently formed, is Copper 115, or Gold 115, respectively. It is preferred that the power metal 115, is a high conductivity power metal 115 or a low resistance power metal 115.

FIG. 10 shows a cross-section of a power transistor IC chip 43, with power metal 115. Basically, the wafer or substrate 33, after the deposition of seed layers 114 and 113, is coated with about 15 um to about 30 um thick photoresist depending upon the desired thickness of the power metal 115. A negative pattern is photolithographically defined using a mask, which opens the resist from about 2 um to about 4 um wider than the via pattern openings 154 in the passivation layer 112. A low resistivity metal 115, such as, for example, copper 115, or gold 115, is then electroplated using the industry standard electrolytes with the supplier recommended brightners and additives. The thickness of the electroplated metal 115, is preferably between about 10 um and about 35 um depending upon the required sheet resistivity; typically, copper is about 10 um and gold is about 13 um thick to provide a sheet resistivity of less than about 2 m-ohm per square. Subsequent to electroplating, resist is removed and the seed layer 114 and 113, are chemically etched using the thick deposited metal 115 as a mask.

Figure 11:
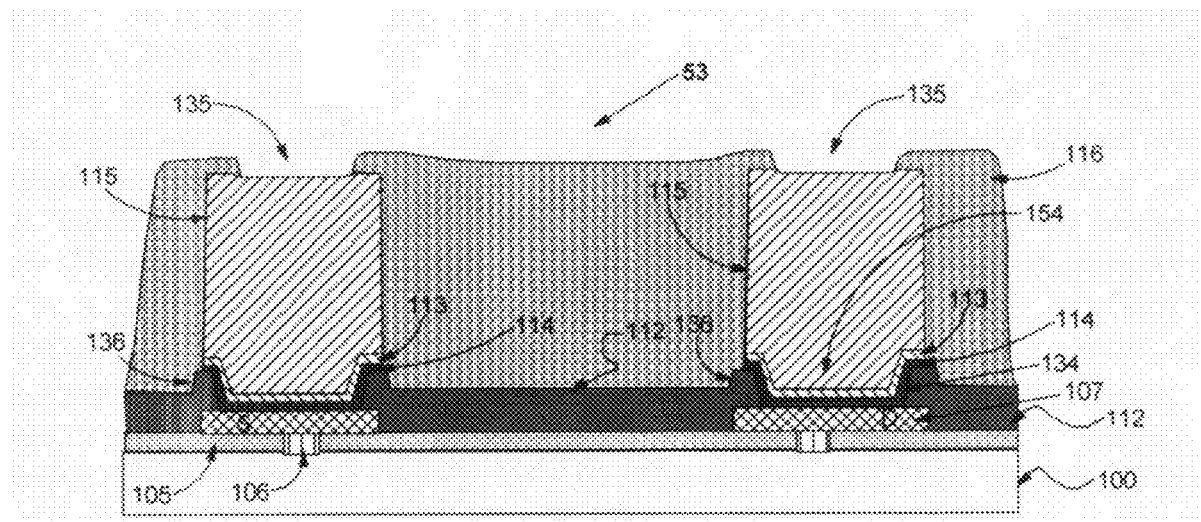
FIG. 11 shows a cross sectional view of an IC substrate after the power metal interconnect is coated with flowable dielectric planarized according to the teaching of the present invention and openings are photolithographically made to expose selected parts of the power metal.

Referring now to FIG. 11, the wafer or substrate 43, is next processed by spin coating a photoimageable polyimide layer 116, having a thickness of between about 12 um to about 25 um depending upon the thickness of electroplated power metal 115. The primary objective is to achieve a polyimide layer 116 with a thickness adequate to cover the top or upper surface of the thick power metal layer 115. It should be noted that any flowable dielectric, such as organo-silicate glass (also known as SOG), may be used followed by photolithography and dry or wet etching of the dielectric. It should be noted that it is not necessary for polyimide layer 116 to be planarized; however, a planarized passivation offers the advantage of providing a bond pad which is larger than the power metal area. A planarized polyimide layer 116 can be obtained by spray coating or by using a diluted polyimide and spin coating it in several thin layers; each spin-coated layer 116 is followed by a soft bake to remove the solvent. For the final two coats, an undiluted polyimide 116 is preferably used. After the first of the last two coats, the wafer or substrate 43, is subjected to an etching process, such as, for example, an oxygen etch, to remove the polyimide material 116 on top of the metal features; this polyimide material 116 is generally less than about 1 micron thick.

A pad via opening mask is exposed and the polyimide 116, is developed to open the vias 135 in the polyimide layer 116 aligned to power metal 115. The polyimide 116 is then hard baked at about 300 C for about 1 hour. The planarization obtained by this method is usually less than about 3 um for a 14 um total polyimide film thickness.

FIG. 11 shows a cross sectional view of an IC substrate 53, after the power metal 115, interconnect has been coated and processed with a flowable dielectric 116, which is planarized according to the teaching of the present invention and via or openings 135, are photolithographically made to expose selected parts of the power metal 115. As shown in FIG. 11, the via 135, are etched in a planarized polyimide layer 116. However, for some applications it may not be necessary to planarize the polyimide layer 116, but the via 135, could be photolithographically exposed and opened.

Figure 12:
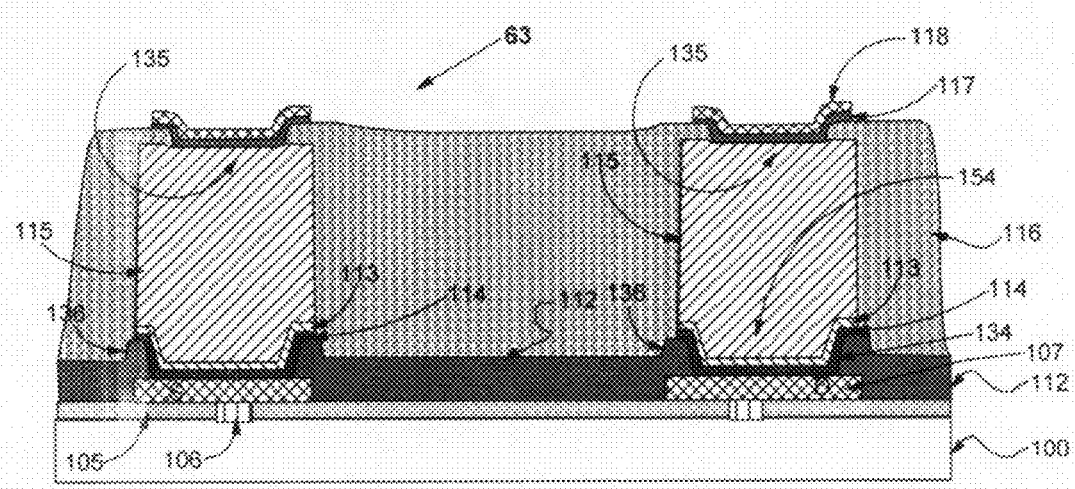
FIG. 12 shows a cross-sectional view of the structure of one embodiment of the present invention.

FIG. 12 shows a cross-sectional view of the structure 63, of one embodiment of the present invention. Basically, FIG. 12 shows the cross-sectional view of the power transistor IC chip 63, with power metal 115, and wire bondable metal 118 or wire bond pads 118, of a preferred embodiment of the present invention where the bond pad materials are thermally stable with the power metal 115 and the thick aluminum wire 128, as more clearly shown in FIG. 13. After the process, as illustrated with reference to FIG. 11, metal pad for wire bonding are defined on pad vias. In the preferred embodiment of the invention, the bond pad metal is composed of a barrier metal 117, and a wire bondable metal 118. The barrier metal 117, is preferably selected from a group comprising Titanium, Chromium, Tantalum, Tantalum Nitride, Titanium-Tungsten, to name a few. The bond pad metal 118, is preferably selected from a group comprising Aluminum, Aluminum-Copper, Aluminum-Silicon, Nickel, Nickel with between about 7 percent to about 11 percent Phosphorus, Nickel-Vanadium, Gold or any combination thereof, or in any stacking sequence. For Aluminum wire bond, Aluminum or its alloys, and Ni—P are preferred bond pad metals. It is preferred that the Nickel surface is protected from oxidation by a thin layer of Gold. It is also preferred that the Gold thickness be less than about 1000 A thick.

The barrier metal layer 117, and the wire bondable metals 118, are sequentially deposited, such as using sputter deposition, on the wafer or substrate 53. The barrier metal layer 117, thickness is preferably less than about 3 kA, and the wire bondable metal layer 118, is preferably less than about 3 um thick. A pad mask is thereafter photolithographically defined and the pad metal layers, 117 and 118, are wet etched to define the metal pads.

Figure 13:
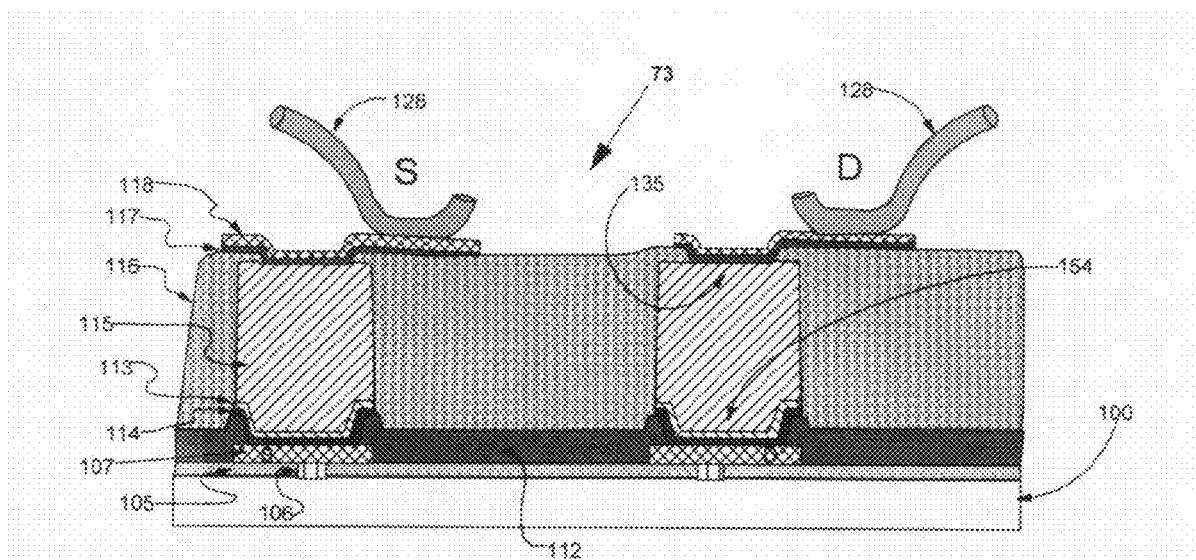
FIG. 13 shows a cross-section of an IC substrate with power metal having pad metal caps larger than the width of the power metal interconnect.

FIG. 13 shows a cross-section of an IC substrate 73, with power metal 115, having pad metal caps 118, which are larger than the width of the power metal interconnect 115. FIG. 13 further shows the power metal stack of the present invention after a wire 128, has been secured to the pad 118. A planarized polyimide layer 116, is shown in FIG. 13, which is for the purpose of illustration, so that a larger pad size can then be defined. However, a non-planarized polyimide layer 116, could also be used with this invention. A larger bond pad 118, is preferred for a variety of reasons, such as, for example, (i) if the power metal pads 115 are too small for the wire bond; (ii) if the diameter of the wire 128 is too large to be accommodated on bond pads; (iii) in order to provide a cushioning effect during wire bonding to protect the inorganic dielectrics used underneath; or (iv) to protect devices sensitive to mechanical forces, such as Micro Electro Mechanical Systems (MEMS) if used.

Figure 14:
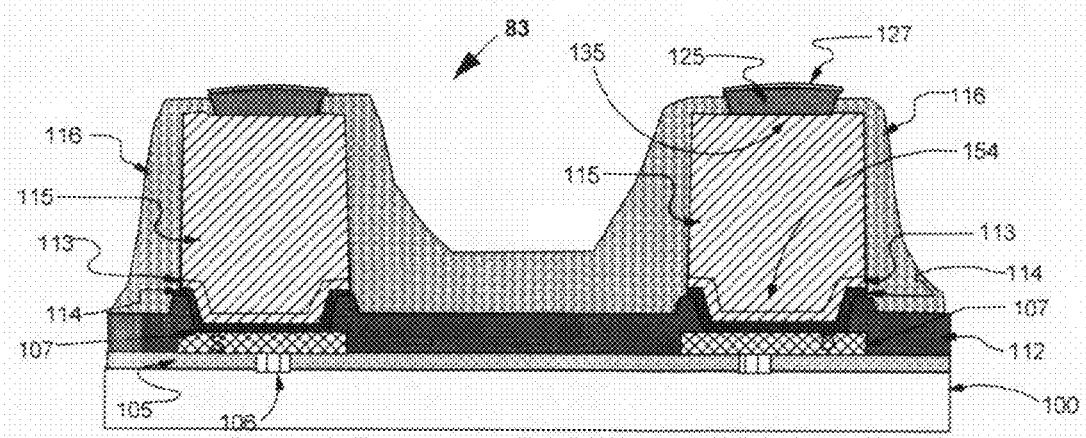
FIG. 14 shows a cross-section of another embodiment of the present invention showing an IC substrate having power metal interconnect having metal pad caps selectively deposited at selected sites.

FIG. 14 shows a cross-section of another embodiment of the present invention showing an IC substrate 83, having power metal interconnect having metal pad caps 125, selectively deposited at selected sites. In this embodiment of the present invention, the process of the preferred embodiment is followed until making openings in the flowable dielectric layer as shown in FIG. 11; however, only copper 115, can be used as the power metal 115, in this embodiment to create the IC substrate 83. A planarized polyimide 116, could be used but it offers no advantages for this embodiment. Referring to FIG. 14, the bond pads 125, are defined, such as, for example by electroless plating of Ni—P on exposed surface of copper 115. This could be followed by immersion gold layer 127, if desired. It should be appreciated that the metal pads 125, that are formed to create the IC substrate 83, have the same dimension as the via or opening 135 as illustrated in FIG. 11.

Figure 15:
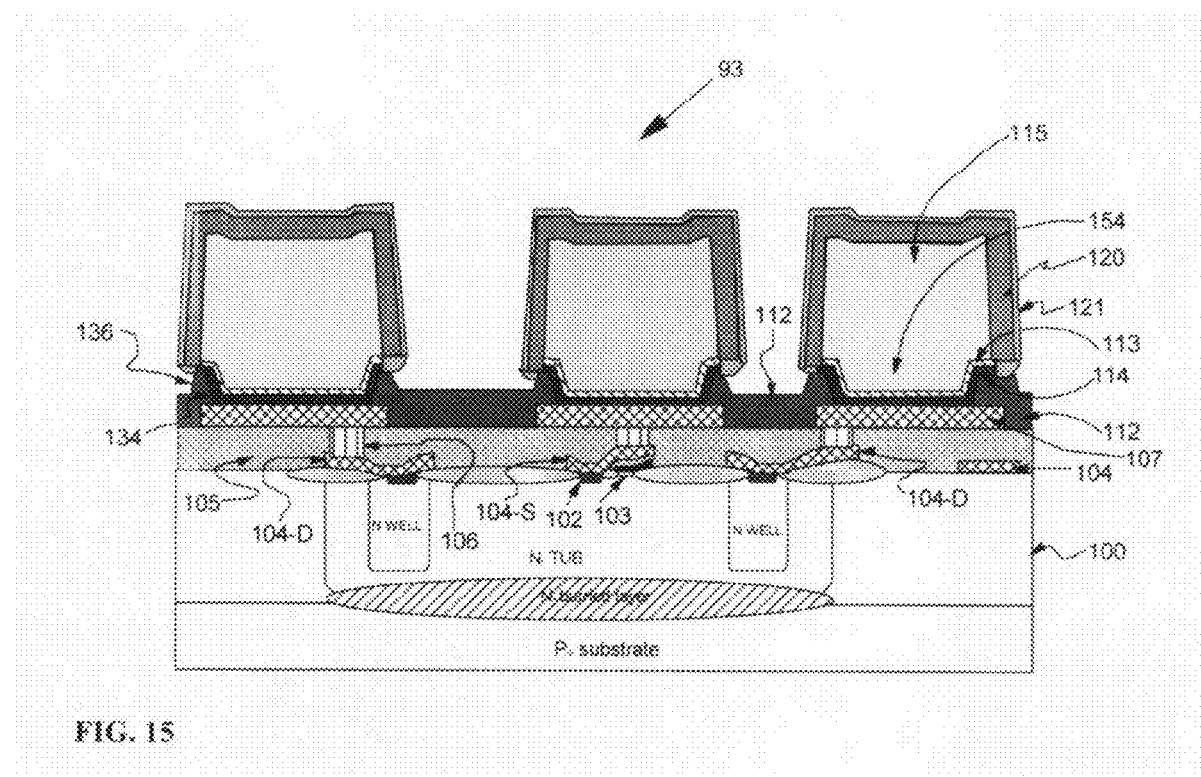
FIG. 15 shows a cross-section of yet another embodiment of the present invention showing an IC substrate with power metal interconnect coated on all sides with electroless nickel and a thin coating of gold.

FIG. 15 shows a cross-section of yet another embodiment of the present invention showing an IC substrate 93, with power metal interconnect 115, coated on all sides with electroless nickel 120, and a thin coating of gold 121. The power transistor IC 93, is processed as in the preferred embodiment, until the process of defining the power metal 115, shown in FIG. 10. Only copper 115, can be used as the power metal 115, in this embodiment. A layer of electroless nickel 120, such as, NiP 120, followed by immersion gold 121, is deposited in the thickness range of between about 2 um to about 6 um. Electroless Nickel—Immersion Gold (commonly known as ENIG) plating service is available from several vendors who use their proprietary methods. Generally these processes are accomplished by first cleaning the surface of the copper 115, activating the surface of the copper 115, in a palladium ion solution, electrolessly plating nickel 120, from a phosphate bath to desired thickness of Nickel 120, followed by immersion gold plating to form gold layer 121. FIG. 15 further shows the cross-section of the power transistor IC 93, with copper power metal 115, coated with electroless-Nickel 120, and immersion gold 121 layer. The plated Nickel 120, typically contains between about 7 percent to about 11 percent Phosphorous; the NiP reduces the Nickel diffusivity in Copper 115. In copper power metal interconnect 115, with a coating of electroless Nickel-Phosphorus 120, diffusion of Nickel into Copper 115, at about 200 C for about 1000 hours is negligibly small to cause any resistivity increase in Copper 115. Further, the NiP 120, provides a much more thermally stable bond with wire 128, such as, an Aluminum wire 128. Furthermore, the high hardness value of NiP 120, provides a non-deformable base for thick aluminum wire bonding. The immersion gold 121, is a self-limiting process; the thickness of the plated gold 121, is between about 200 A to about 1000 A.

The plating process for the layer of gold could be selected from a group comprising immersion gold plating process or electroless gold plating process.

Any of the aforementioned embodiments and modifications thereof will result in the formation of power metal 115, for various applications. While the invention has been disclosed with reference to embodiment of preferred methods of providing Aluminum or Nickel-Phosphide pads for bonding of aluminum wire 128, it would be apparent to those skilled in the art that various changes to the process, material or sequence of above serialized process steps can be made without departing from the scope of the invention and the appended claims. For example, one may choose to terminate the process after the definition of power metal 115, especially if gold 115, is chosen as power metal 115, as shown in FIG. 10 where layer 115 is gold; or, one may choose to deposit electroless nickel first followed by power metal definition. Whereas the aforementioned preferred method and its embodiments are illustrated for DMOS power transistors, they are specifically designed to include fine geometry CMOS and Bipolar technologies; for example, the one or more layers of aluminum interconnects could be used for fine geometry CMOS or Bipolar circuitries because the thick power metal 115, is added only on the coarse geometry interconnects of power transistors.

Those skilled in the art will recognize that the invention can be practiced with modification within the spirit and scope of the appended claims; for example, the substrate could be Si—Ge or any II-V compound like GaAs.

While the present invention has been particularly described in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for providing a power metal interconnection (115) with a metal cap (117/118) on a substrate (100) having at least one exposed interconnect metal feature (107), said process comprising the steps of:
    (a) depositing at least one dielectric layer (112) over said at least one exposed interconnect metal feature (107) and said substrate (100);
    (b) defining a photolithographic pattern for at least one power metal interconnect (115) over said substrate (100), and etching said at least one dielectric layer (112) to expose said interconnect metal feature (107) on said substrate (100);
    (c) sputter depositing a seed layer (114/113), wherein said seed layer (114/113) comprises a first barrier layer (114) and a low resistivity power metal layer (113);
    (d) defining a photoresist pattern for at least one power metal interconnect (115), and selectively removing photoresist from said at least one power metal interconnect locations (114/113) such that at least a portion of said low resistivity power metal layer (113) is exposed;
    (e) electroplating a low resistivity power metal layer (115) using said seed layer (114/113) as an electrode;
    (f) removing said photoresist, and wet-etching said seed layer (114/113) using said electroplated metal (115) as a mask, and forming said power metal interconnect (115);
    (g) depositing at least one layer of at least one flowable dielectric (116);
    (h) photolithographically defining a pattern for at least one pad-via layout (135) in said flowable dielectric layer (116);
    (i) opening said at least one pad-via (135) to expose a portion of said power metal (115);
    (j) sputter cleaning and sequentially sputter depositing a second barrier layer (117) and a wire bondable metal (118) over said at least one pad-via (135); and
    (k) photolithographically defining a pattern for a pad layout and etch removing said wire bondable metal (118) and said second barrier layer (117).

2. The process of claim 1, wherein said dielectric layer is selected from a group consisting of silicon nitride, and composite of silicon oxide and silicon nitride.

3. The process of claim 1, wherein said dielectric layer is etched using a first etching process and a second etching process, wherein said first etching process is an isotropic etching process and said second process is an anisotropic etching process.

4. The process of claim 3, wherein said first etching process uses gas selected from a group consisting of Helium and Nitrogen Trifluoride.

5. The process of claim 3, wherein said second etching process uses gas selected from a group consisting of CF4, CHF3 and Argon.

6. The process of claim 1, wherein said first barrier metal and said second barrier metal are selected from a group consisting of Ti, TiN, TiW, Cr, Ta, TaN and combinations thereof.

7. The process of claim 1, wherein said low resistivity power metal is selected from a group consisting of Gold and Copper.

8. The process of claim 1, wherein the thickness of said electroplated low resistivity power metal is between about 5 um to about 50 um, and preferably between about 5 um to about 20 um.

9. The process of claim 1, wherein said flowable dielectric is selected from a group consisting of polyimide, BCB, organo-silicate glass and combinations thereof.

10. The process of claim 9, wherein said polyimide or flowable dielectric is photosensitive.

11. The process of claim 1, wherein at least a portion of the surface of said flowable dielectric and said power metal interconnect is planarized.

12. The process of claim 1, wherein said wire bondable metal is selected from a group consisting of Aluminum, Aluminum-copper, Aluminum-silicon, Aluminum-copper-silicon, Nickel, Nickel-Phosphorus, Nickel-Vanadium, Gold, and combinations thereof.

13. The process of claim 1, wherein said second barrier metal is processed, using a process selected from a group consisting of wet etching, Reactively Ion Etching, and combinations thereof.

14. The process of claim 1, wherein said wire bondable metal is processed using a process selected from a group consisting of wet etching, Reactively Ion Etching, and combinations thereof.

15. A process for providing a power metal interconnection (115) with a metal cap (125/127) on a substrate (100) having at least one exposed interconnect metal feature (107), said process comprising the steps of:
   (a) depositing at least one dielectric layer (112) over at least one interconnect metal feature (107) on said substrate (100);
   (b) photolithographically defining a pattern for a power metal interconnect (115) and etching said dielectric layer (112) to expose a portion of said interconnect metal feature (107);
   (c) sputter depositing a seed layer (114/113), wherein said seed layer (114/113) comprises a first barrier layer (114) and a copper power metal layer (113);
   (d) defining a negative photoresist pattern for said power metal interconnect (115) over said substrate (100);
   (e) electroplating a copper power metal layer (115) using said seed layer (114/113) as an electrode;
   (f) removing said photoresist and wet etching said seed layer (114/113) using said electroplated copper (115) as mask, and forming a copper power metal interconnect (115);
   (g) depositing at least one layer of a flowable dielectric (116) over said substrate (100);
   (h) photolithographically defining a pattern for a pad-via layout (135) in said flowable dielectric layer (116);
   (i) opening a pad-via (135) to expose at least a portion of said copper power metal interconnect (115);
   (j) electroless Nickel-Phosphorus plating (125) said exposed copper surface (115) and forming a Nickel-Phosphorus wire bond pad (125) on top of said copper power metal interconnect (115); and
   (k) plating said Nickel-Phosphorus wire bond pad (125) with a layer of gold (127).

16. The process of claim 15, wherein the thickness of said Nickel-Phosphorus metal pad is at least about 1 um.

17. The process of claim 15, wherein a layer of gold is formed over said Nickel-Phosphorus metal pad by an immersion gold plating process.

18. The process of claim 15, wherein said plating process for said layer of gold is selected from a group consisting of immersion gold plating process and electroless gold plating process.

19. A process for providing a power metal interconnection (115) with protective surface coating (120/121) on a substrate (100) having at least one exposed interconnect metal feature (107), said process comprising the steps of:
   (a) depositing a dielectric layer (112) over said interconnect metal feature (107) and said substrate (100);
   (b) defining a pattern for a power metal interconnect (115) and etching said dielectric layer (112) to expose said interconnect metal feature (107);
   (c) sputter depositing a seed layer (114/113) comprising of a first barrier metal layer (114) and a first copper power metal layer (113);
   (d) defining a negative photoresist pattern for said power metal interconnect (115) over said substrate (100);
   (e) electroplating a second copper power metal layer (115) using said seed layer (114/113) as an electrode;
   (f) removing said photoresist and wet etching said seed layer (114/113) using said electroplated copper layer (115) as mask, and forming a copper power metal interconnect (115);
   (g) electroless Nickel-Phosphorus plating (120) said copper power metal interconnect (115) and encasing at least a portion of said copper power metal interconnect (115) with a coating of a Nickel-Phosphorus layer (120), and
   (h) plating said coating of said Nickel-Phosphorus layer (120) with a layer of gold (121).

20. The process of claim 19, wherein the thickness of said Nickel-Phosphorus coating over said copper power metal interconnect is at least about 1 um.

21. The process of claim 19, wherein a layer of gold is formed over said Nickel-Phosphorus coating by an immersion gold plating process.

22. The process of claim 19, wherein said plating process for said layer of gold is selected from a group consisting of immersion gold plating process and electroless gold plating process.

23. A process of providing power metal interconnections (115) on a substrate (100) having at least one exposed interconnect metal feature (107), said process comprising the steps of:
   (a) depositing a dielectric layer (112) over said interconnect metal feature (107) and said substrate (100);
   (b) photolithographically defining a pattern for a power metal interconnect (115) and etching said dielectric layer (112) to expose said interconnect metal feature (107);
   (c) sputter depositing a seed layer (114/113), wherein said seed layer (114/113) comprises of a barrier layer (114) and a gold layer (113);
   (d) defining a negative photoresist pattern for said power metal interconnect (115);
   (e) electroplating a gold power metal (115) using said seed layer (114/113) as an electrode; and (f) removing said photoresist and wet etching said seed layer (114/113) using said electroplated gold (115) as mask forming a gold power metal interconnect (115), and wherein said gold power metal interconnect (115) comprises said sputter deposited gold layer (113) and said electroplated gold power metal layer (115).

* * * * *